US011295962B2

(12) United States Patent
Kenney et al.

(10) Patent No.: US 11,295,962 B2
(45) Date of Patent: Apr. 5, 2022

(54) LOW TEMPERATURE PROCESS FOR DIODE TERMINATION OF FULLY DEPLETED HIGH RESISTIVITY SILICON RADIATION DETECTORS THAT CAN BE USED FOR SHALLOW ENTRANCE WINDOWS AND THINNED SENSORS

(71) Applicant: The Board of Trustees of the Leland Stanford Junior University, Stanford, CA (US)

(72) Inventors: Christopher J. Kenney, Menlo Park, CA (US); Julie D. Segal, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 16/507,777

(22) Filed: Jul. 10, 2019

(65) Prior Publication Data
US 2020/0020543 A1 Jan. 16, 2020

Related U.S. Application Data

(60) Provisional application No. 62/696,183, filed on Jul. 10, 2018.

(51) Int. Cl.
*H01L 21/324* (2006.01)
*H01L 21/265* (2006.01)
(Continued)

(52) U.S. Cl.
CPC .............. *H01L 21/324* (2013.01); *G01T 1/24* (2013.01); *H01L 21/26513* (2013.01);
(Continued)

(58) Field of Classification Search
CPC ............ H01L 21/324; H01L 21/26513; H01L 31/1804; H01L 31/1864; H01L 31/1896; H01L 31/1025; G01T 1/24
See application file for complete search history.

(56) References Cited

U.S. PATENT DOCUMENTS 6,051,483 A 4/2000 Lee
7,928,021 B2 4/2011 Kowalski
(Continued)

FOREIGN PATENT DOCUMENTS

EP 1855321 11/2007
JP 2018-56211 * 4/2018

OTHER PUBLICATIONS

Machine translated document (Year: 2018).*
(Continued)

*Primary Examiner* — Ahmed N Sefer
(74) *Attorney, Agent, or Firm* — Lumen Patent Firm

(57) ABSTRACT

Fabrication of vertical diodes for radiation sensing using a low temperature microwave anneal is provided. This kind of anneal allows the back side processing to be performed after the front side processing is done without damaging the front side structures. This enables a simplified fabrication of thinned detectors compared to a conventional silicon on insulator process. Another feature that this technology enables is a thin entrance window for a detector that also serves as the doped diode termination. Such thin entrance windows are especially suitable for detection of low energy radiation.

11 Claims, 9 Drawing Sheets

(51) Int. Cl.
  *H01L 31/18* (2006.01)
  *H01L 31/102* (2006.01)
  *G01T 1/24* (2006.01)
(52) U.S. Cl.
  CPC ...... *H01L 31/1025* (2013.01); *H01L 31/1804* (2013.01); *H01L 31/1864* (2013.01); *H01L 31/1896* (2013.01)

(56) References Cited

U.S. PATENT DOCUMENTS

| | | | |
|---|---|---|---|
| 9,064,797 B2 | 6/2015 | Tsai | |
| 9,385,156 B2 | 7/2016 | Tsai | |
| 2009/0224284 A1* | 9/2009 | Nemoto | H01L 21/2255 257/109 |
| 2012/0025087 A1* | 2/2012 | Daghighian | H01L 29/66462 250/370.01 |
| 2013/0119522 A1* | 5/2013 | Schmidt | H01L 21/223 257/655 |
| 2013/0175529 A1* | 7/2013 | Mauder | H01L 29/861 257/51 |
| 2013/0336033 A1* | 12/2013 | Hirler | H01L 29/7804 363/124 |
| 2014/0004690 A1 | 1/2014 | Isogai | |
| 2014/0038392 A1* | 2/2014 | Yonehara | B81C 1/0038 438/463 |
| 2014/0319641 A1* | 10/2014 | Willmeroth | H01L 31/103 257/463 |
| 2015/0053983 A1* | 2/2015 | Tsai | H01L 21/2236 257/52 |
| 2015/0182995 A1* | 7/2015 | Theodore | H05B 6/6491 219/759 |
| 2015/0198775 A1 | 7/2015 | Sandhu | |
| 2016/0155879 A1* | 6/2016 | Deptuch | H01L 27/14658 257/222 |
| 2016/0227612 A1 | 8/2016 | Kowalski | |
| 2017/0055923 A1* | 3/2017 | Meylan | A61B 6/4085 |
| 2017/0373110 A1* | 12/2017 | Von Kanel | H01L 27/1469 |
| 2019/0035909 A1* | 1/2019 | Schmidt | H01L 29/7397 |
| 2019/0172860 A1* | 6/2019 | Von Kanel | H01L 27/14658 |

OTHER PUBLICATIONS

Kenney et al., "Active-edge planar radiation sensors", 2006, Nuclear Instruments and Methods in Physics Research A 565, pp. 272-277.

Povoli et al., "Development of planar detectors with active edge", 2011, Nuclear Instruments and Methods in Physics Research A 658, pp. 103-107.

Kenney et al., "Use of active-edge silicon detectors as X-ray beam monitors", 2007, Nuclear Instruments and Methods in Physics Research A 582, pp. 178-181.

Calderini et al., "Development of Edgeless Silicon Pixel Sensors on p-type substrate for the ATLAS High-Luminosity Upgrade", 2016, Nuclear Instruments and Methods in Physics Research A 831, pp. 133-136.

* cited by examiner

LOW TEMPERATURE PROCESS FOR DIODE TERMINATION OF FULLY DEPLETED HIGH RESISTIVITY SILICON RADIATION DETECTORS THAT CAN BE USED FOR SHALLOW ENTRANCE WINDOWS AND THINNED SENSORS

CROSS REFERENCE TO RELATED APPLICATIONS

This application claims the benefit of U.S. provisional patent application 62/696,183, filed on Jul. 10, 2018, and hereby incorporated by reference in its entirety.

GOVERNMENT SPONSORSHIP

This invention was made with Government support under contract DE-ACO2-765F00515 awarded by the Department of Energy. The Government has certain rights in the invention.

FIELD OF THE INVENTION

This invention relates to radiation detectors.

BACKGROUND

To support the high luminosity upgrades for state of the art high energy physics detectors, thinned sensors for hybrid pixel detectors (bump-bonded) or strip detectors are important. In addition to improved radiation hardness and reduced detector mass, high luminosity leads to high occupancy rates, a problem which is compounded for large angle tracks that pass through multiple pixels. This problem can be partially addressed with thinned sensors.

Fully depleted high-resistivity silicon diode arrays are typically deployed as high energy physics sensors. Because silicon wafer processing tools are not equipped to handle thin wafers, the thinning step cannot be performed until the after front-side structure is complete, requiring post-processing to create the diode contact at the backside of the wafer. Conventionally, the backside diode contact process requires an ion implantation step, followed by a high temperature anneal to activate the dopant. However, this high temperature step, if performed after the frontside is complete, would damage the completed structures on the front side.

Currently the only available solutions, such as using Silicon-on-insulator (SOI) wafers as shown in FIG. 1, or laser annealing, are very expensive. A low-cost solution is needed to support the large area of detectors required for high energy physics detector upgrades and future experiments.

SUMMARY

We have found that a low temperature microwave anneal of an ion implant, e.g., as described in U.S. Pat. No. 7,928,021 "System For and Method Of Microwave Annealing Semiconductor Material", hereby incorporated by reference in its entirety, can be used to create diode terminations in thinned detectors to address the above identified problem.

Furthermore, we have found that this kind of low temperature microwave anneal process can also help with other design issues in radiation detectors. For example, the penetration depth of low energy radiation into a semiconductor substrate is relatively low. Such detectors have a highly doped entrance window to serve as one of the diode terminations for the detector. Radiation that is absorbed in this window is lost as opposed to being detected. Therefore it is important to make the entrance window as thin as possible to minimize this part of the detector loss. Since dopant thermal diffusion (which tends to increase window thickness) is greatly reduced by annealing at lower temperatures, a low temperature microwave anneal as described above is also beneficial for this application.

Performing backside processing with a low temperature anneal in this way is also consistent with the integration of additional circuitry on the front side (e.g., complementary metal-oxide-semiconductor (CMOS) signal processing electronics, charge coupled device (CCD) circuitry etc.).

Applications include radiation imaging sensors for soft x-rays, optical light, UV light, low energy electrons, low energy ions, high energy particle physics, astrophysics and other scientific imaging with x-rays and gamma rays.

Significant advantages are provided.

For shallow entrance window applications: MBE (molecular beam epitaxy) and laser annealing are existing solutions. Both are very expensive, hard to do technically, and have low throughput.

For thinned sensors, SOI (silicon on insulator) processing followed by removal of the silicon handle wafer is an existing solution. Others have been proposed but not shown to be feasible. SOI wafers are very expensive.

For CMOS/CCD post-processing: processing backside early in process flow is the main alternative for fully depleted silicon, which is expensive and complicates the process flow.

DETAILED DESCRIPTION

Figure 1:
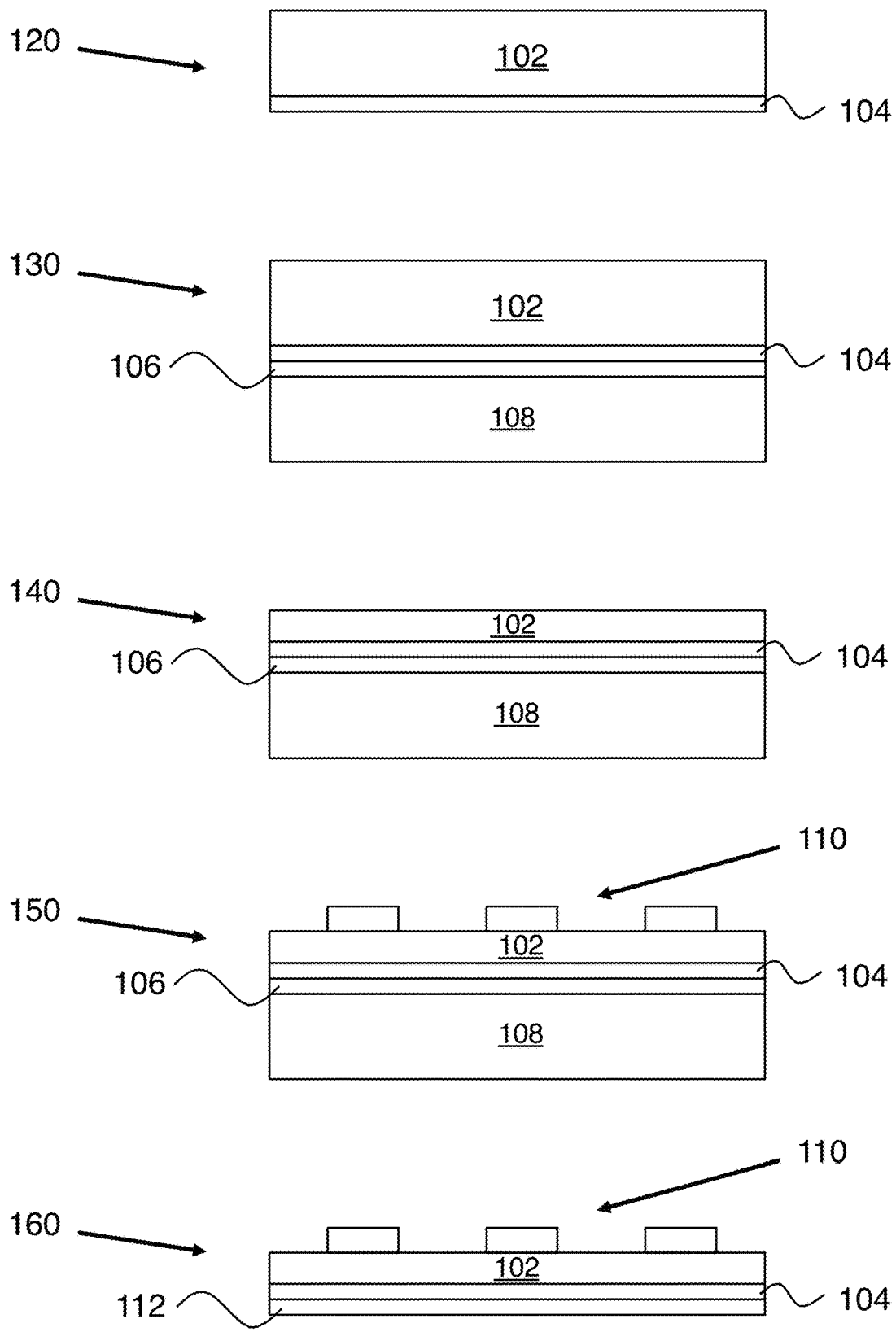
FIG. 1 shows a prior art process for fabrication of thin radiation detectors.

To better appreciate the present invention, it is helpful to briefly review fabrication of thin detectors as in the conventional SOI (silicon on insulator) process of FIG. 1. Here the starting point 120 shows a sensor wafer 102 having an annealed (i.e., activated) backside doped region 104. Step 130 shows the result of growing an oxide layer 106 on doped region 104 and bonding oxide layer 106 to a support wafer 108. Step 140 shows the result of thinning sensor wafer 102. Step 150 shows the result of fabricating front side structures 110 on sensor wafer 102. Step 160 shows the result of removing support wafer 108 and depositing back side metal 112. As can be seen, this is a relatively complicated (and therefore expensive) process.

Figure 2:
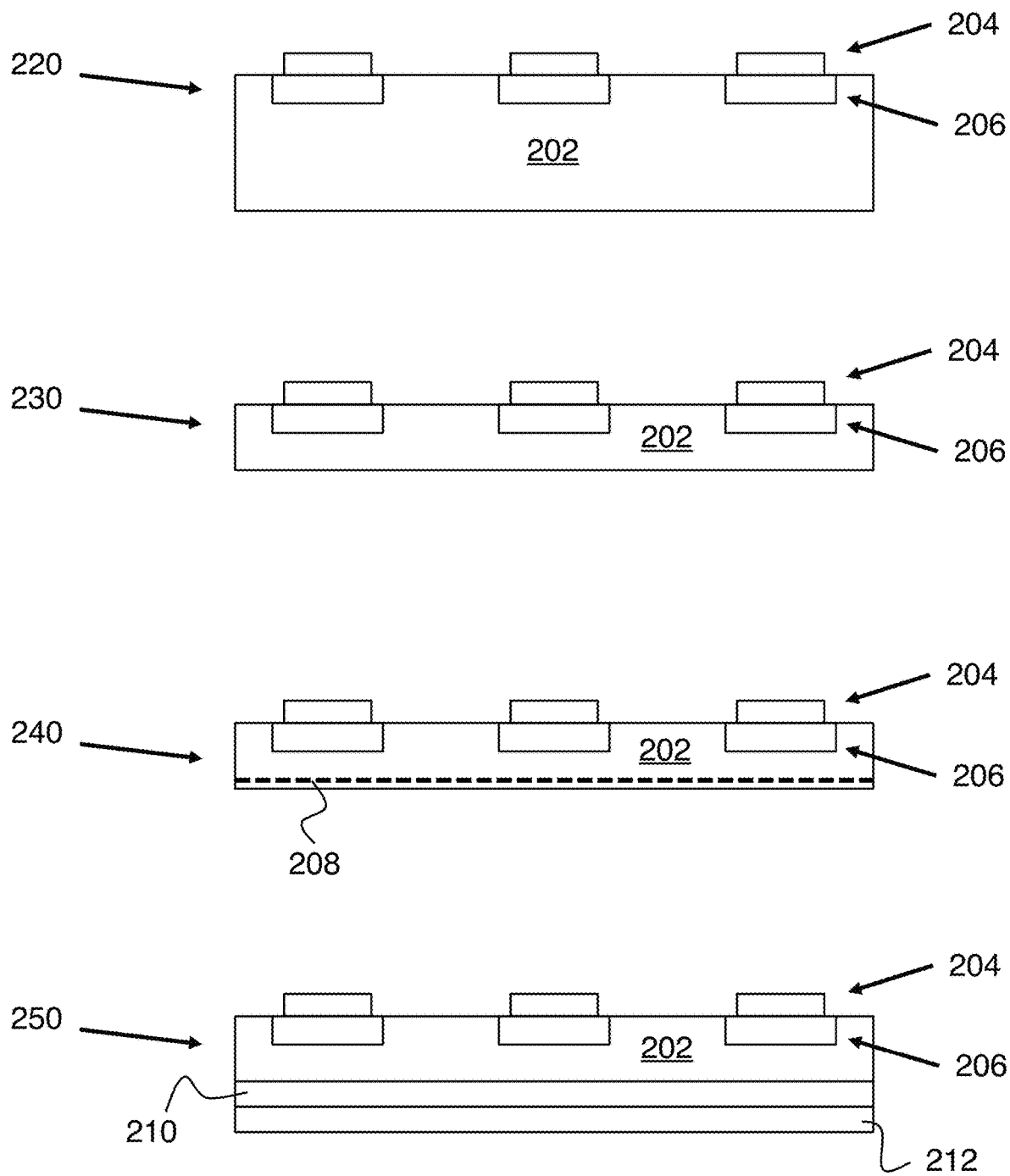
FIG. 2 shows a first fabrication process according to an embodiment of the invention.

FIG. 2 shows an example of how fabrication of thinned detectors can be accomplished by an embodiment of the invention. Here starting point 220 is a sensor wafer 202 having front side structures 204 (e.g., metal) and 206 (e.g., diffusions) disposed on it. Step 230 shows the result of thinning sensor wafer 202. Step 240 shows the result of implanting one or more dopant species 208. Step 250 shows the result of activating dopant species 208 with a microwave anneal as described above to provide back side doped region 210, followed by deposition of back side metal 212 on back side doped region 210. As can be seen, this process is simpler than the process of FIG. 1.

Importantly, the low temperature microwave anneal of step 250 does not damage front side structures 204 and 206.

Figure 3:
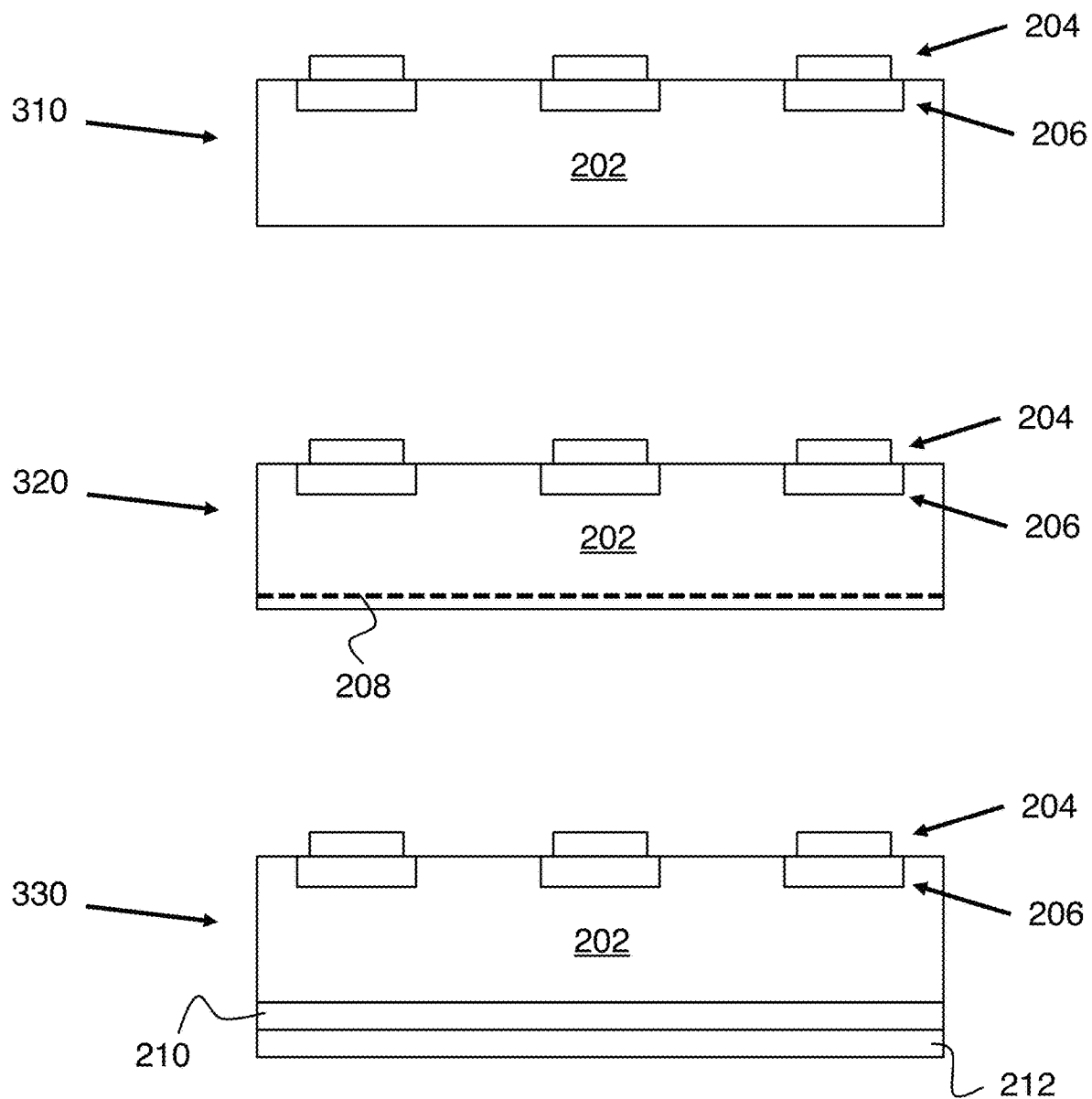
FIG. 3 shows a second fabrication process according to an embodiment of the invention.

The process of FIG. 2 can also be performed without the step of thinning the sensor wafer. FIG. 3 shows the resulting process. Here starting point 310 is a sensor wafer 202 having front side structures 204 (e.g., metal) and 206 (e.g., diffusions) disposed on it. Step 320 shows the result of implanting one or more dopant species 208. Step 330 shows the result of activating dopant species 208 with a microwave anneal as described above to provide back side doped region 210, followed by deposition of back side metal 212 on back side doped region 210. Here also, the low temperature microwave anneal of step 330 does not damage front side structures 204 and 206.

Figure 4:
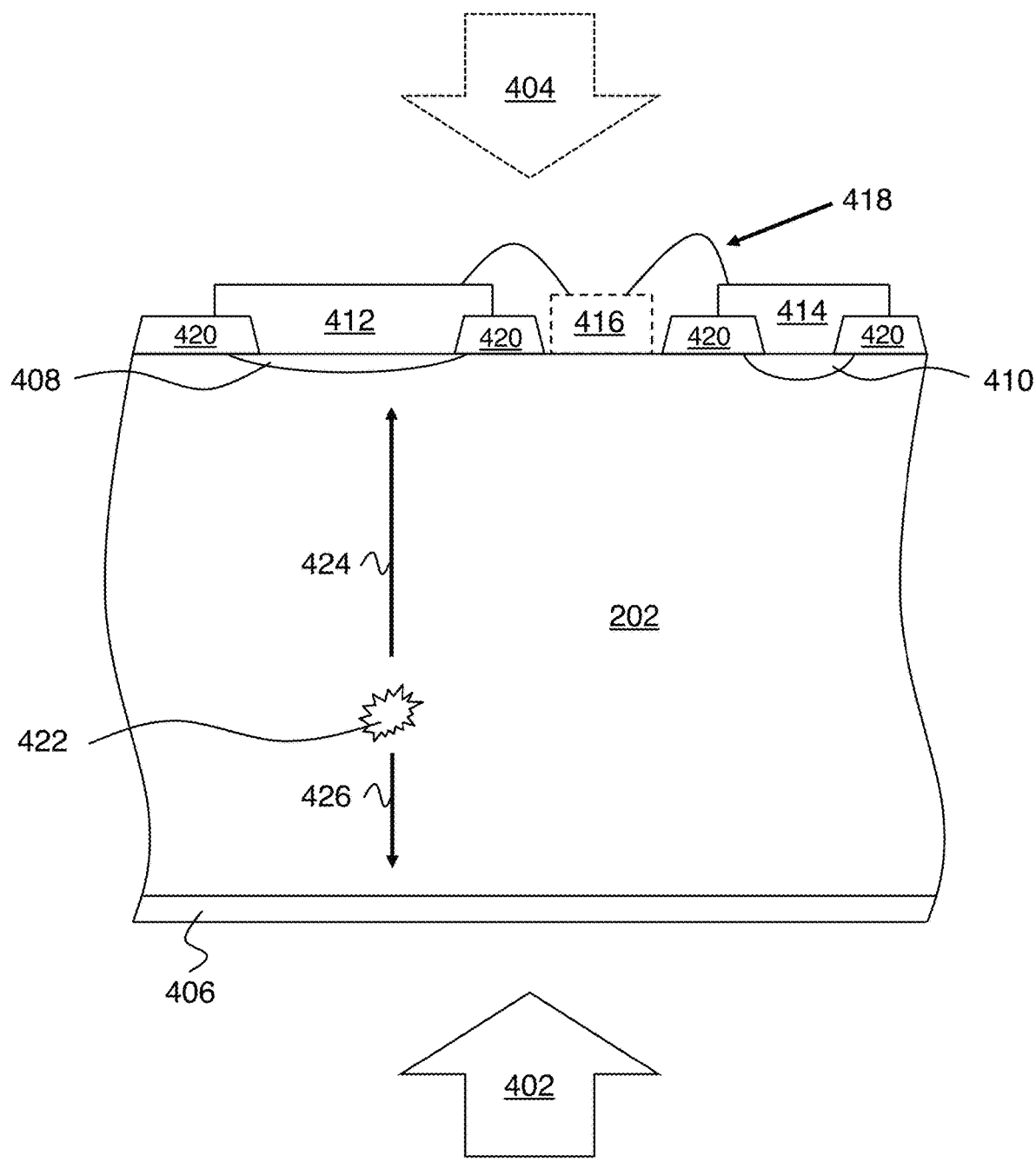
FIG. 4 shows an exemplary device fabricated according to an embodiment of the invention.

Accordingly, one embodiment of the invention is a method of making a radiation detector. This method includes:

providing a semiconductor substrate;

fabricating first electronic circuitry on a first side of the semiconductor substrate, where the first electronic circuitry includes at least a first diode termination (e.g., 408 on FIG. 4);

backside ion implanting one or more dopant species to provide a backside ion implant on a second side of the semiconductor substrate opposite the first side of the semiconductor substrate;

activating the backside ion implant with a microwave annealing process to form a second diode termination (e.g., 406 on FIG. 4), whereby a diode structure extending from the first diode termination to the second diode termination is formed (see FIG. 4 and the associated description);

wherein the activating the backside ion implant is performed after the fabricating first electronic circuitry;

wherein the diode structure is fully depleted in operation (see FIG. 4 and the associated description) such that radiation absorbed in the semiconductor substrate generates electron-hole pairs to provide a radiation detector output signal from the diode structure.

In cases where thinning the detector is desired, the method can further include thinning the semiconductor substrate by removing material from the second side of the semiconductor substrate. Here the thinning of the semiconductor substrate is performed after fabricating the first electronic circuitry and prior to the backside ion implant.

Practice of the invention does not depend critically on the substrate used for the detector. Suitable substrates include, but are not limited to: silicon, germanium, gallium arsenide, indium phosphide, cadmium telluride, cadmium sulfide and diamond.

Preferably the maximum temperature of the microwave annealing process is 500° C. or less. This microwave annealing process allows for the selective heating of dopants in silicon. The dopants become polarized in the microwave chamber, allowing them to become activated while the bulk silicon temperature remains at less than 500 C. It is expected that this kind of microwave annealing can also be used in connection with other substrates. Work to date has experimentally confirmed this for germanium and silicon substrates.

FIG. 4 shows an exemplary device fabricated according to an embodiment of the invention. Here 202 is the substrate (e.g., n-type silicon), 406 is the backside doped region (e.g., n-type), 408 is front side doping (e.g., p-type) to define a pixel, 410 is front side doping (e.g., p-type) to define a guard ring, 412 is the pixel contact, 414 is the guard ring contact, optional 416 is any kind of circuitry, and 420 is an insulator (e.g., field oxide).

Radiation can be incident on the second side of the semiconductor substrate, e.g., radiation 402. In this case, the second diode termination (i.e., backside doped region 406) forms an entrance window of the diode structure. This thin entrance window configuration is a preferred approach when low energy radiation is to be detected, such as soft X-rays, ultraviolet radiation, visible radiation, near-infrared radiation, low energy electrons, and low energy ions. Practice of the invention does not depend critically on the presence or kind of circuitry 416, such as signal processing circuitry, charge coupled device circuitry etc.

Here near-infrared radiation is defined as electromagnetic radiation having a wavelength in a range from 700 nm to 1600 nm. Visible radiation is defined as electromagnetic radiation having a wavelength in a range from 400 nm to 700 nm. Ultraviolet radiation is defined as radiation having a wavelength in a range from 10 nm to 400 nm. Soft X-ray radiation is defined as electromagnetic radiation having a wavelength less than 10 nm and an energy of 2 keV or less. Low energy electron radiation is defined as accelerated electrons having an energy of 50 keV or less. Low energy ion radiation is defined as accelerated ions having an energy of 5 MeV or less.

Alternatively, the diode structure can be configured to detect radiation incident on the first side of the semiconductor substrate, e.g., radiation 404.

Note that embodiments of the invention are not restricted to detection of low energy radiation as specified above. Detectors according to principles of the invention can detect any radiation capable of exciting electron-hole pairs in the substrate. Here this is schematically shown as excitation 422 in substrate 202 generating an electron 426 and a hole 424 that move in opposite directions under the applied reverse bias (region 406 is biased positive with respect to region 408). Practice of the invention does not depend critically on regions 406 and 408 being n-type and p-type respectively. These doping types can be switched, in which case 426 is a hole, 424 is an electron, and the polarity for reverse bias is region 408 being biased positive with respect to region 406.

Note that detectors of this kind are basically vertical device that extend through the entire thickness of substrate 202. E.g., in the example of FIG. 4, regions 408, 202 and 406 form a vertical diode. This is in sharp contrast to planar technology, where all significant device regions are formed on one side of the substrate.

Another important feature of detectors of this type is that they are fully depleted in operation. This means that the applied reverse bias is sufficient to ensure that the depletion region in substrate 202 extends all the way from doped region 406 to doped region 408.

In a purely planar geometry, this would be enough to ensure that the entire substrate 202 is an active region for detection of absorbed radiation. However, real devices have edge effects to deal with. In particular, unpassivated edges can lead to a significant reduction in the active area of a detector, because radiation absorbed too close to such an unpassivated edge will generate electron hole pairs that are lost to edge effects as opposed to contributing to the detector signal. Such edges can also cause other undesirable effects like increased leakage current.

Figure 5:
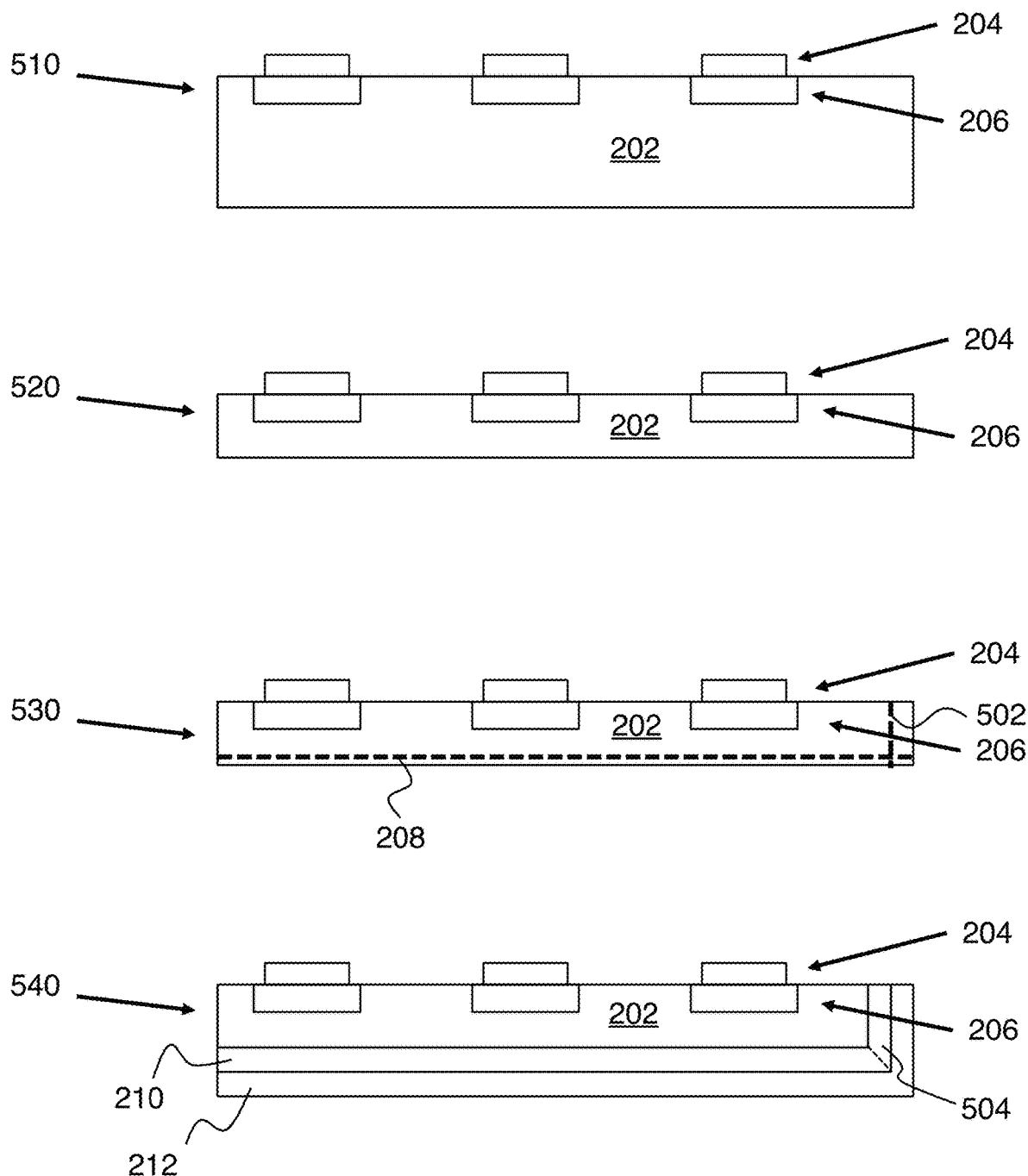
FIG. 5 shows a third fabrication process according to an embodiment of the invention.

However, recent work has provided improved edge passivations for detectors of this kind, and embodiments of the invention are compatible with these better edge passivations. FIG. 5 shows an example. This process is similar to the example of FIG. 2, except that step 530 also includes an edge implant 502, and that step 540 results in formation of edge doping region 504. Making the device edges available for processing this way can be done by any suitable method, such as dicing, deep etching etc. Naturally a similar modification of the process of FIG. 3 is also possible.

In the example of FIG. 5, a microwave anneal is used to activate an edge ion implant. It is also possible for the edge doping to be provided more conventionally, e.g., by diffusion doping as part of the front side processing. In both cases, the net effect is to reduce the size of inactive detector regions.

Figure 6:
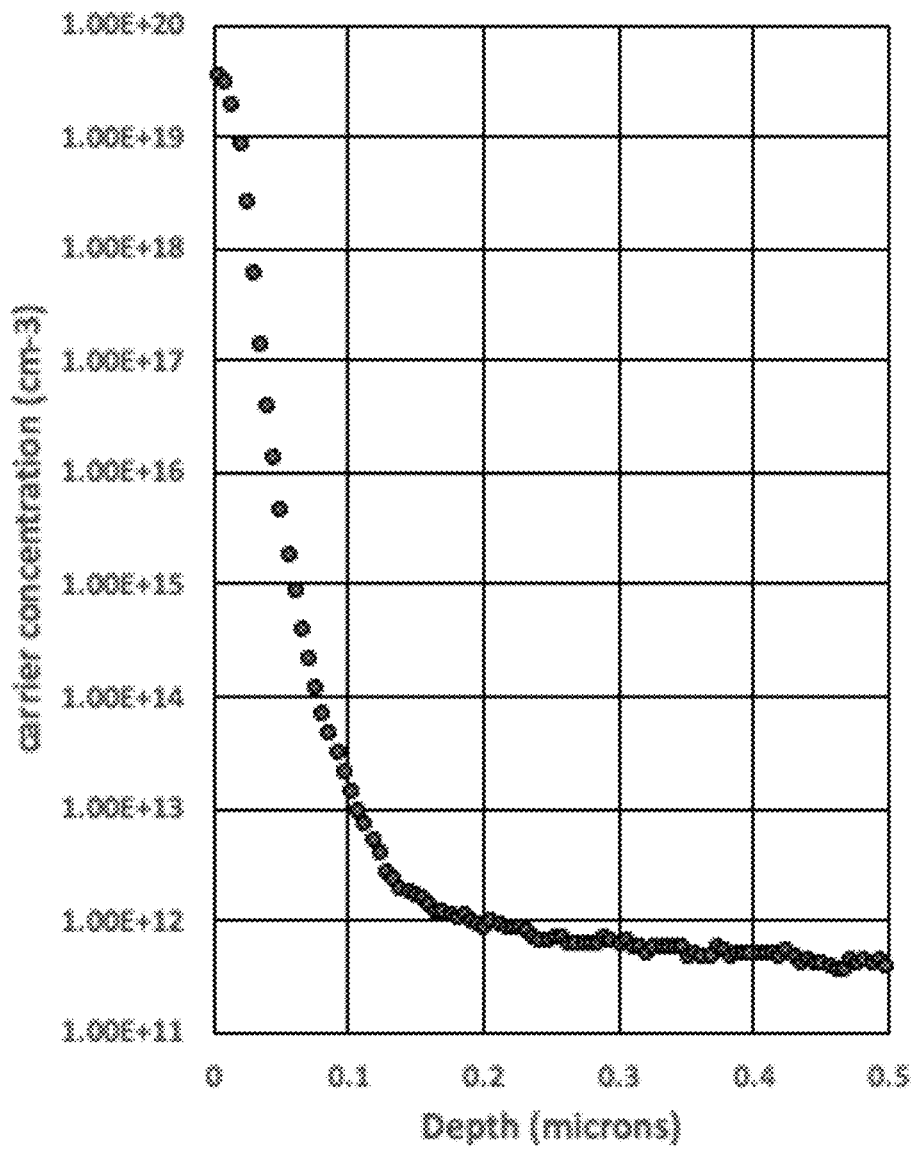
FIG. 6 is an exemplary plot of spreading resistance profile after activation of an implant with a microwave anneal.

FIG. 6 is an exemplary plot of spreading resistance profile (SRP) measurement results on a test wafer implanted with Arsenic at 10 KeV after microwave annealing. The dopant is sufficiently activated to form the diode termination. Furthermore, Secondary Ion Mass Spectroscopy (SIMS) measurements show little or no diffusion compared to the implanted profile, demonstrating the suitability of this approach for making thin entrance windows for detectors.

Figure 7:
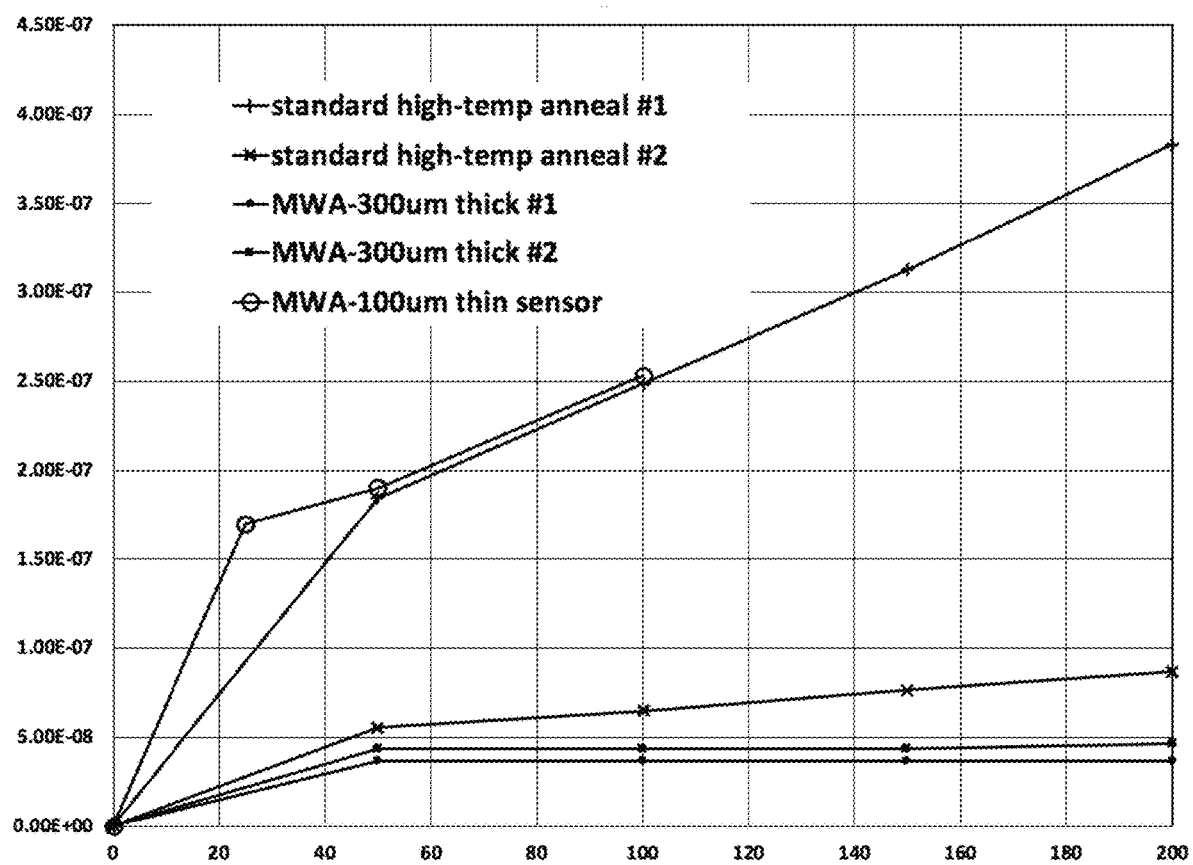
FIG. 7 is a plot of dark current results for various detector fabrication methods.

FIG. 7 is a plot of dark current results for various detector fabrication methods. These results are bench measurements of the reverse bias diode currents, and they show reasonable dark current and no junction breakdown up to 200V for 300 µm thick wafers and 100V for the 100 µm thick wafer. The results are comparable to a conventional annealed junction, as shown in the figure.

Figure 8:
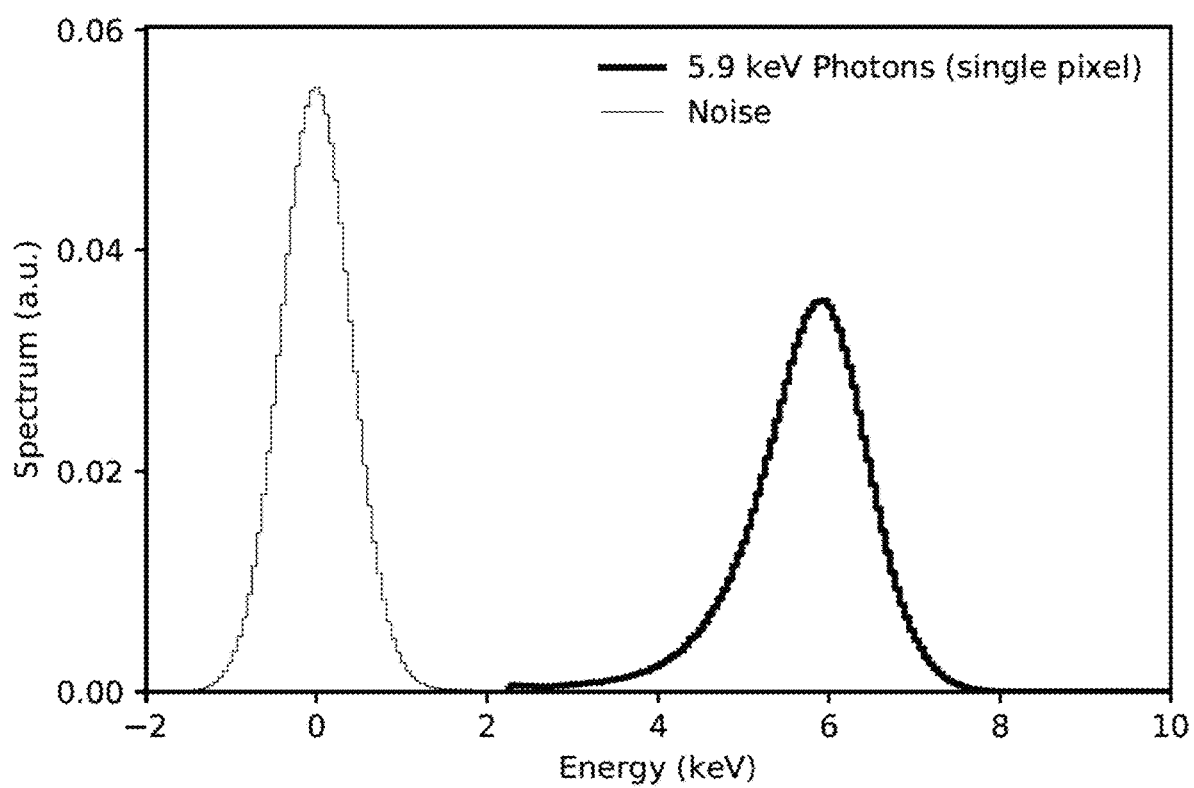
FIG. 8 is a plot of the Fe-55 spectrum as measured with a detector having a microwave annealed front entrance window.

FIG. 8 is a plot of the Fe-55 spectrum as measured with a detector having a microwave annealed front entrance window. Similar results are obtained here for thinned and unthinned detectors.

Figure 9:
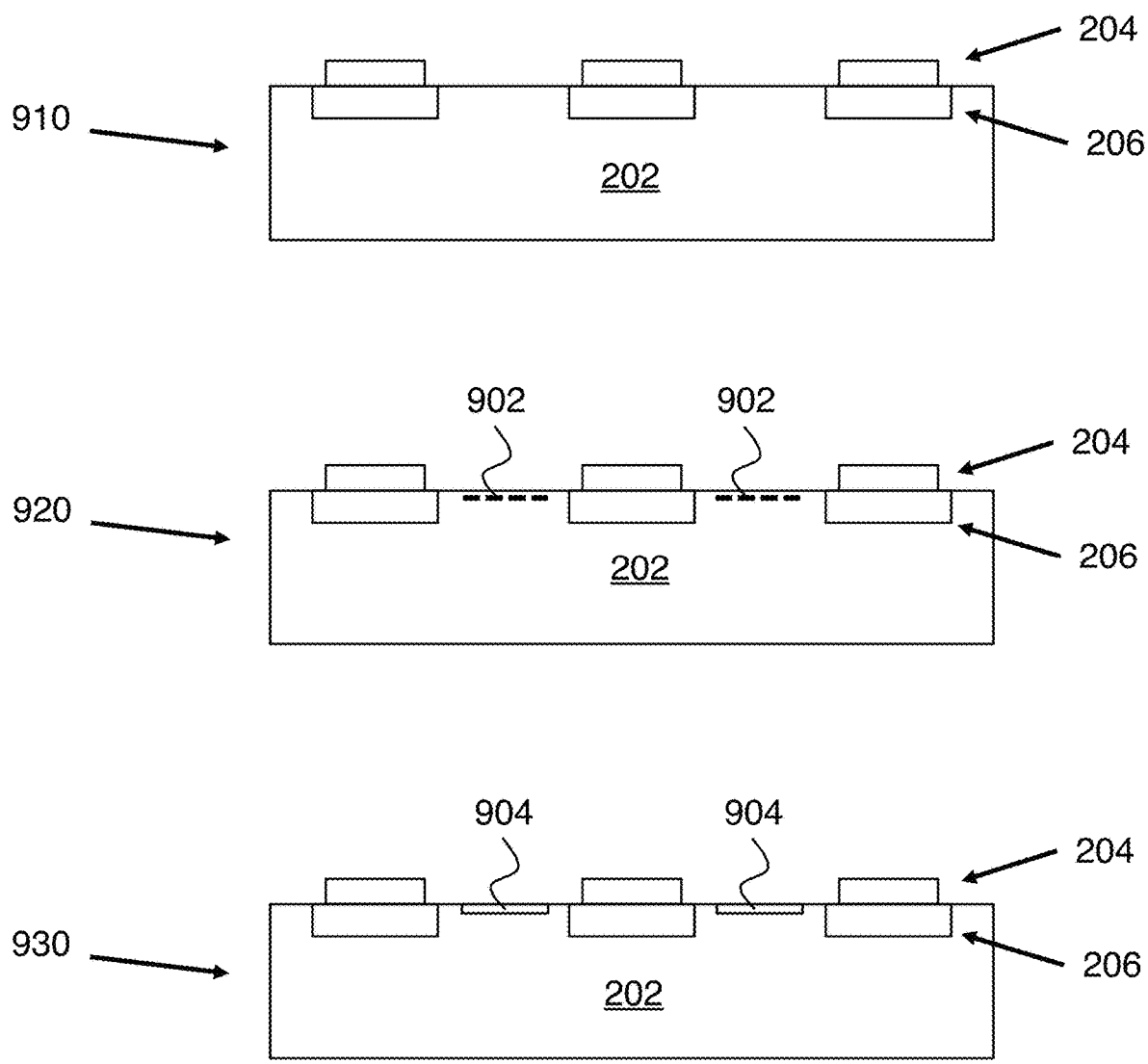
FIG. 9 shows a second fabrication process according to an embodiment of the invention.

The preceding examples have all related to fully depleted diode radiation detectors having a vertical geometry that extends from the top surface of the substrate to the bottom surface of the substrate. It is also possible to fabricate fully or partially depleted radiation detectors having thin entrance windows in a lateral geometry. FIG. 9 shows an exemplary process of this kind. Here starting point 910 is a sensor wafer 202 having front side structures 204 (e.g., metal) and 206 (e.g., diffusions) disposed on it. Step 920 shows the result of implanting one or more dopant species 902 into the front side. Step 930 shows the result of activating dopant species 902 with a microwave anneal as described above to provide front side diode terminations 904. Here also, the low temperature microwave anneal of step 930 does not damage front side structures such as 204 and 206. Structures having this kind of thin entrance window for radiation detection are more readily fabricated with this two-step process than they would be with conventional fabrication.

Single sided devices of this kind can have edge passivations as described above. Furthermore, any kind of first side circuitry, such as signal processing circuitry can be fabricated prior to formation of the thin entrance windows/diode terminations 904. Since doped regions 904 on FIG. 9 are intended to serve as entrance windows, radiation to be detected is preferably incident from the top in the structure provided by step 930.

The invention claimed is:

1. A method of making a radiation detector, the method comprising:
    fabricating first electronic circuitry on a first side of a semiconductor substrate, wherein the first electronic circuitry includes at least a first diode termination;
    backside ion implanting one or more dopant species to provide a backside ion implant on a second side of the semiconductor substrate opposite the first side of the semiconductor substrate;
    activating the backside ion implant with a microwave annealing process to form a second diode termination, whereby a radiation detector diode structure extending from the first diode termination to the second diode termination is formed;
    wherein the activating the backside ion implant is performed after the fabricating first electronic circuitry;
    wherein the radiation detector diode structure is fully depleted in operation such that radiation absorbed in the semiconductor substrate generates electron-hole pairs to provide a radiation detector output signal from the radiation detector diode structure.

2. The method of claim 1,
    further comprising thinning the semiconductor substrate by removing material from the second side of the semiconductor substrate,
    wherein the thinning the semiconductor substrate is performed after the fabricating first electronic circuitry and prior to the backside ion implanting.

3. The method of claim 1, wherein the radiation detector diode structure is configured to detect radiation incident on the first side of the semiconductor substrate.

4. The method of claim 1, wherein the radiation detector diode structure is configured to detect radiation incident on the second side of the semiconductor substrate, whereby the second diode termination forms an entrance window of the radiation detector diode structure.

5. The method of claim 4, wherein radiation to be detected is selected from the group consisting of: soft X-rays, ultraviolet radiation, visible radiation, near-infrared radiation, low energy electrons, and low energy ions.

6. The method of claim 1, wherein the first electronic circuitry includes signal processing circuitry for the radiation detector output signal.

7. The method of claim 1, wherein the first electronic circuitry includes charge coupled device circuitry for the radiation detector output signal.

8. The method of claim 1, further comprising:
    forming one or more edges of the semiconductor substrate;
    edge ion implanting one or more dopant species to provide an edge ion implant at the one or more edges of the semiconductor substrate;
    activating the edge ion implant with a microwave annealing process to form one or more edge passivations;
    whereby one or more inactive detector regions in proximity to the one or more edges of the semiconductor substrate is reduced in size.

9. The method of claim 1, further comprising:
    forming one or more edges of the semiconductor substrate;
    performing diffusion doping of one or more dopant species to form one or more edge passivations at the one or more edges of the semiconductor substrate;

whereby one or more inactive detector regions in proximity to the one or more edges of the semiconductor substrate is reduced in size.

10. The method of claim 1, wherein the semiconductor substrate is selected from the group consisting of: silicon, germanium, gallium arsenide, indium phosphide, cadmium telluride, cadmium sulfide and diamond.

11. The method of claim 1, wherein a maximum temperature of the microwave annealing process is 500° C. or less.

* * * * *